(12) United States Patent
Hoopengarner

(10) Patent No.: US 7,312,602 B2
(45) Date of Patent: Dec. 25, 2007

(54) ELECTRICAL METER WITH RETRACTABLE LEADS

(76) Inventor: Paul Hoopengarner, 4423 Bridge Field Rd., W. Dr., Plainfield, IN (US) 46168

( * ) Notice: Subject to any disclaimer, the term of this patent is extended or adjusted under 35 U.S.C. 154(b) by 0 days.

(21) Appl. No.: 10/898,026

(22) Filed: Jul. 23, 2004

(65) Prior Publication Data

US 2006/0028198 A1    Feb. 9, 2006

(51) Int. Cl.
*G01R 7/00* (2006.01)
(52) U.S. Cl. ...................... 324/115; 324/142
(58) Field of Classification Search ........ 324/754–762, 324/115–116, 142, 72.5, 133, 156–157; 242/378.1, 242/376; 361/600–601, 664–666
See application file for complete search history.

(56) References Cited

U.S. PATENT DOCUMENTS

| | | | | |
|---|---|---|---|---|
| 3,829,776 A | * | 8/1974 | Lozoya | ................ 324/122 |
| 3,853,285 A | * | 12/1974 | Woodring | .............. 242/378.1 |
| 3,987,364 A | | 10/1976 | MacCormack et al. | |
| 4,023,101 A | * | 5/1977 | Christoffer | ............... 324/107 |
| 4,079,314 A | | 3/1978 | Jone | |
| 4,105,968 A | | 8/1978 | Mobley et al. | |
| 4,176,315 A | | 11/1979 | Sunnarborg | |
| 4,259,634 A | | 3/1981 | Okamoto et al. | |
| 5,250,893 A | | 10/1993 | Gambill et al. | |
| 5,394,093 A | * | 2/1995 | Cervas | ................... 324/556 |
| 5,672,964 A | | 9/1997 | Vinci | |
| 5,834,929 A | | 11/1998 | Dietz | |
| 5,986,446 A | | 11/1999 | Williamson | |
| 6,137,285 A | | 10/2000 | Walsten et al. | |
| 6,400,133 B1 | | 6/2002 | Vest et al. | |
| 6,731,217 B1 | * | 5/2004 | Warner | ................ 340/650 |
| 6,803,525 B1 | | 10/2004 | Liao | |

* cited by examiner

*Primary Examiner*—Vinh P. Nguyen
(74) *Attorney, Agent, or Firm*—Maginot, Moore & Beck

(57) ABSTRACT

An electrical meter 10 comprises a housing 12 with a spool 14 rotatably mounted therein. A first lead cable 16 and a second lead cable 18 are wound upon the spool 14. A wound spring 90 is connected to the spool and biases the spool against rotation in a direction that allows the lead cables to be unwound. A first head 20 and a second head 22 are respectively included on the end of the first lead cable 16 and the second lead cable 18. The heads abut against the housing and prevent the lead cables from being completely wound upon the spool when the meter is not in use. A circuit board 30 with electrical measurement circuitry is also mounted within the housing 12. The circuit board is electrically connected to a display 40 positioned on the outside of the housing 12.

21 Claims, 4 Drawing Sheets

ELECTRICAL METER WITH RETRACTABLE LEADS

BACKGROUND

Electrical meters are an important tool used by electricians, maintenance technicians and homeowners on a daily basis. Electrical meters are used to take electrical readings in an electrical circuit such as voltage, current, resistance, or continuity. These electrical meters are commonly referred to as voltmeters, multi-meters or continuity meters, depending upon their intended use.

Electrical meters typically include a small hand-held box that houses electrical measurement circuitry. Two lead wires of approximately three feet in length normally extend from the box with heads attached to the ends of the lead wires. The heads are designed for contact with an electrical circuit, thereby allowing the user to take a circuit measurement at the contact point. The leads join the heads to the electrical measurement circuitry within the box. A display is also provided on the box. The display is connected to the electrical measurement circuitry and operable to show the results of measurements taken with the electrical meter.

Electricians typically keep a number of commonly used tools on their person. However, the common electrical meter is not one of these tools because the lead wires that dangle from the meter are awkward to handle and can get in the way of the electrician's work. Unfortunately, if an electrician does not have an electrical meter on his or her person, the electrician is more likely to chance working on an electrical circuit without first testing whether it is hot, as going to get the electrical meter before working on a circuit is viewed as an inconvenience.

Most electricians store their electrical meters in a toolbox with other equipment and tools for use in the field. These toolboxes contain numerous tools arranged in no particular order in the box. When an electrical meter is deposited in a toolbox, the lead wires are exposed to the other tools in the box. In particular, as the toolbox is moved from place to place, the tools inside the box shift within the box. These shifting tools may cut, nick, or otherwise damage the exposed lead wires on the electrical meter. Damaged lead wires may render the electrical meter inoperable. Furthermore, if the insulation around the lead wires is cut and the conductors of the lead wires are actually exposed, the lead wires could injure the user of the electrical meter when a measurement is taken using the meter.

An additional problem with loose lead wires on an electrical meter is that the loose lead wires may become entangled when placed in a toolbox. In particular, movement of the tools within the toolbox may cause the wires to become entangled with each other or with other tools within the box. Lead wire entanglement is problematic, as time is required to untangle the wires before the meter may be used for measurement.

Yet another problem with the lead wires on typical electrical meters is that they can become electrically disconnected from the electrical measurement circuitry within the meter without the user knowing it. In particular, the lead wires are typically connected to the meter housing using a plug. This plug can become dislodged in such a manner that it is not physically removed from the meter housing, but the electrical connections are broken. When this occurs, the user of the meter may obtain a false zero reading. Of course, this is problematic not only because of misleading data, but also for safety reasons, as this lead the user into mistakenly believing that a particular wire is dead when indeed it is hot.

Accordingly, it would be desirable to provide an electrical meter that may be conveniently retained upon the user without concern for dangling lead wires. It would also be desirable to provide an electrical meter that prevents damage to the lead wires regardless of whether the meter is stored in a toolbox or held elsewhere by the user. In addition, it would also be desirable to provide an electrical meter that prevents entanglement of the lead wires when the meter is not in use. Furthermore, it would be desirable to provide an electrical meter having lead wires that are not easily disconnected from the electrical measurement circuitry in the meter.

SUMMARY

An electrical meter that comprises one or more of the above-mentioned desirable features comprises a housing with a spool and at least one lead wire wound upon the spool. The housing is substantially enclosed to protect the lead wires positioned within the housing from damage. The spool is rotatably mounted within the housing and at least one lead cable is wound around the spool. The at least one lead cable comprises a first end connected to the spool and a second end leading through the aperture in the housing. A wound spring is positioned at the center of the spool and one end of the wound spring is connected to the spool. The wound spring biases the spool against rotation in a first rotational direction that releases cable from the spool and out of the aperture. An electrical measurement circuit is mounted within the housing and is electrically connected to the at least one lead cable. A display is positioned on the housing and electrically connected to the electrical measurement circuit. A lock is also positioned upon the housing. The lock is operable to be moved between a locked position and an unlocked position, wherein movement of the lock to the locked position prohibits rotation of the spool in a second rotational direction opposite the first rotational direction. A clip is attached to the exterior of the housing, to allow the user of the meter to attach the meter to his or her person for convenient access and use.

DESCRIPTION

Figure 1:
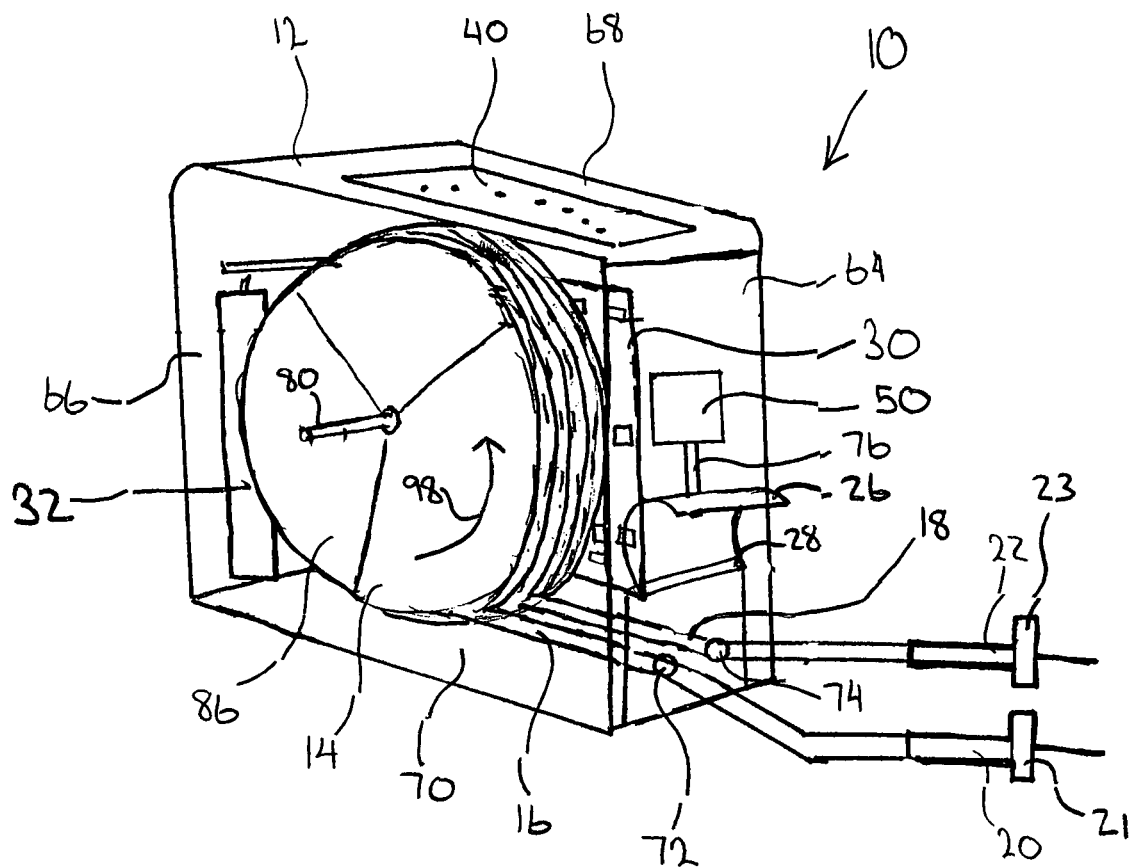
FIG. 1 shows a perspective interior view of an electrical meter with retractable heads.

With reference to FIG. 1, an electrical meter 10 comprises a housing 12 with a spool 14 rotatably mounted therein. A first lead cable 16 and a second lead cable 18 are wound upon the spool 14. A first head 20 and a second head 22 are respectively included on the end of the first lead cable 16 and the second lead cable 18. A circuit board 30 with electrical measurement circuitry is also mounted within the housing 12. The circuit board is electrically connected to a display 40 positioned on the outside of the housing 12.

The housing 12 is sized such that it may be easily held in the hand of a human. In one preferred embodiment, the housing 12 is sized similar to that used with typical tape measures having measurement tapes ranging from ten to fifty feet. The housing is made of a non-conductive plastic material, and is sufficiently durable to resist cracking or destruction when dropped on a concrete surface from a height of five to ten feet. Of course, the housing may be made of numerous other materials such as metal. In one embodiment, the housing is a see-though material, such as a clear plastic, allowing the user to see the interior components of the housing, similar to the view shown in FIG. 1. The housing 12 is essentially a box-like structure with two sidewalls 60 and 62, a front 64, a back 66, a top 68 and a bottom 70. Two apertures 72 and 74 are formed in the front 64 of the housing 12 near the bottom 70. The apertures 72 and 74 are sized to allow the lead cables 16 and 18 to respectively pass through the apertures.

Figure 2:
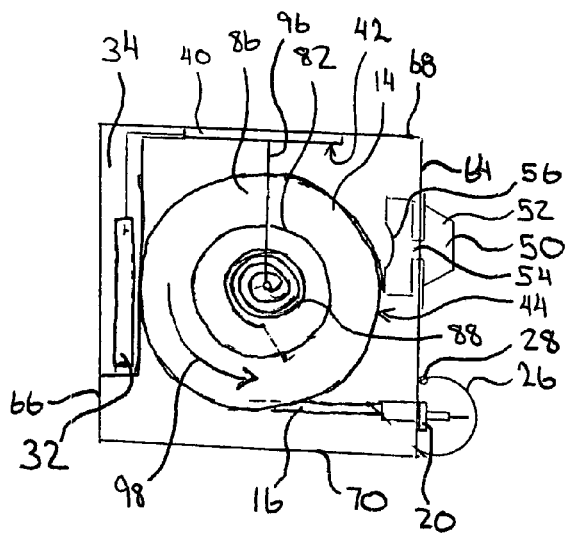
FIG. 2 shows a side elevational cross-sectional view of the electrical meter of FIG. 1.

The spool 14 is arranged on an axis 80 that extends across the center of the housing 12 from one sidewall 60 to the opposite sidewall 62. The axis 80 is stationary, and the axis 80 passes through the center of the spool 14, allowing the spool to rotate upon the axis. As shown in FIG. 2, the spool 14 includes an interior circumference 82 and a peripheral circumference 84. A ring-shaped winding surface is provided at the interior circumference 82 for winding the lead cables upon the spool 14. Disc-shaped guide walls 86 are placed on the sides of the spool 14, and the circumferential edges of the guide walls provide the peripheral circumference 84 of the spool. The guide walls 86 are provided to retain the lead cables 16 and 18 upon the spool 14 and prevent the lead cables from falling off the spool during winding (FIG. 2 shows only the guide wall 86 in the position upon the spool where the lead cables are wound).

Figure 3:
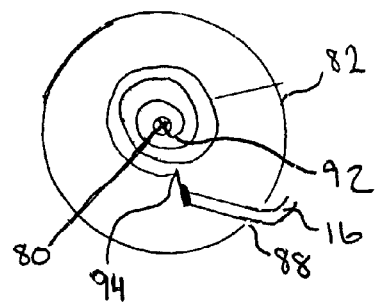
FIG. 3 shows an enlarged view of a wound spring connected to the interior of a spool on the electrical meter of FIG. 1.

As shown in FIG. 3, the ring shaped winding surface 82 includes an opening 88 through which one end of each lead 16, 18 is inserted such that each lead extends into the center portion of the spool 14. Threading one end of each lead cable through the opening 88 connects the lead cables to the spool. Heads 20 and 22 are provided on the opposite ends of the lead cables 16 and 18. The heads may also be referred to as leads or contacts or other terms used by those of skill in the art. Each head includes a contact surface that is electrically connected to the conductor in the lead cable. Each contact surface is designed for engagement with an electrical circuit. Examples of contact surfaces and associated heads include tips of a probe and the teeth of an alligator clip. Of course, numerous other types of contact surfaces and heads could be used, as will be recognized by one of skill in the art. Furthermore, a plug may be provided on the end of the lead cables for accepting different types of heads, as is known in the art. This allows the heads to be interchangeable, thereby providing numerous head options for the user of the meter.

Figure 6:
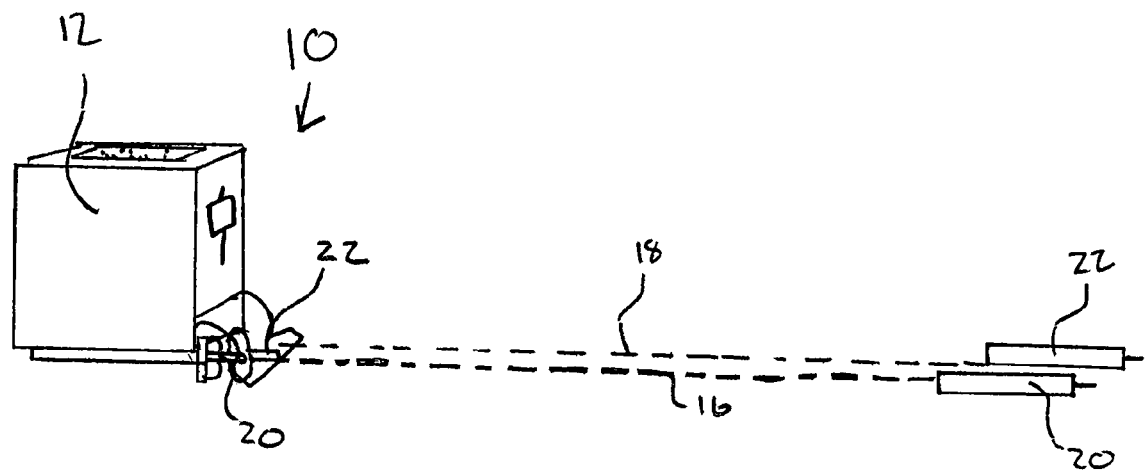
FIG. 6 shows a perspective view of the electrical meter of FIG. 1 with heads of the meter extended.

The heads 20 and 22 shown in FIG. 1 each include an enlarged portion 21 and 23. The enlarged portions 21 and 23 of the head are larger in size than the apertures 72 and 74 in the housing, and these enlarged portions prevent the heads from being retracted into the housing by the spool 14. FIG. 6 shows the heads 20 and 22 in two positions relative to the housing 12. In the first position, the cable leads 16 and 18 are retracted in the housing such that the heads abut against the housing. In this first position, one end of each lead cable leads through one of the apertures in the housing. In one embodiment, the head is entirely out of the housing and the end of the lead cable extends through the aperture. In another embodiment, a portion of the head is actually inserted into the aperture and the end of the lead cable leads through the housing via the head. In any event, the enlarged portion of the head prevents the entire head from being inserted into the aperture. In the second position shown in FIG. 6, the heads are pulled away from the housing 12, causing the associated cable leads (indicated by dotted lines 16 and 18) to extend from the housing 12. As set forth in the following paragraphs, release of the heads when in the second extended position causes the leads to be wound upon the spool, thereby pulling the heads back toward the housing.

A wound spring 90 is positioned at the center of the spool 14. FIG. 3 shows an enlarged view of the interior spool circumference 82 and concentric wound spring 90. As shown in FIG. 3, the wound spring 90 includes a center end 92 and a peripheral end 94. The center end 92 of the wound spring 90 is connected to the stationary axis 80. The peripheral end 94 of the wound spring 90 is connected to the ring shaped winding surface 82 at the interior circumference of the spool 14. In the embodiment shown in FIG. 3, the connection between the peripheral end 94 of the wound spring 90 and the spool 14 is loosely made by the lead cables 16 and 18 which extend through the opening 88 in the spool and join to the peripheral end of the wound spring. Because the lead cables 16 are wound upon the spool, a connecting linkage between the spool 14 and the wound spring 90 is established, such that rotation of the spool results in rotation of the peripheral end 94 of the wound spring. The wound spring 90 biases the spool 14 against rotation in the direction of arrow 98 (See FIGS. 1 and 2).

Electrical traces/paths (not shown) are provided on the wound spring for conducting electric current from the lead cables. In particular, two insulating layers are provided upon the wound spring as paths from the center end 92 to the peripheral end 94 of the wound spring 90. A conducting layer is positioned upon each insulating layer/path to provide the electrical trace/path. The ends the lead cables 16 and 18 are connected to the electrical traces to provide an electrical path from the cable leads to the center end of the wound spring 90. Wires 96 provide a connection between the electrical traces on the wound spring and the circuit board 40.

Figure 4:
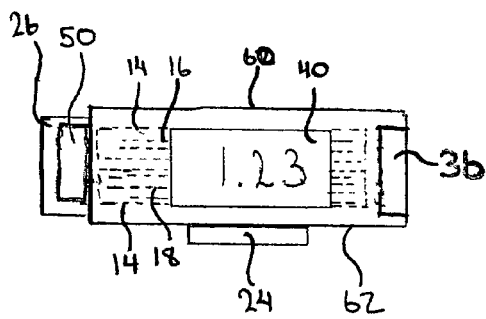
FIG. 4 shows a top view of the electrical meter of FIG. 1.
Figure 5:
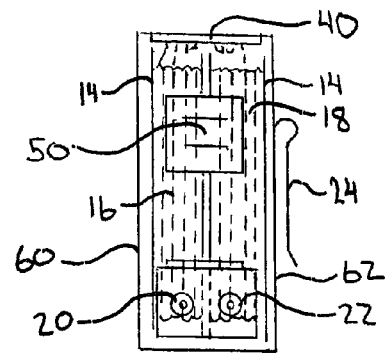
FIG. 5 shows a front elevational view of the electrical meter of FIG. 1.

In one preferred alternative embodiment, two independently rotating spools 14 are provided such that each lead cable 16 and 18 is wound around one of the spools. FIGS. 4 and 5 provide a top view and a front view, respectively, of the housing 12 with dotted lines to show the location of the wound lead cables 16 and 18 upon the two separate spools 14. In this embodiment, a separate metal spring is provided at the center of each spool 14 and the metal spring itself may serve as the electrical path from the end of each cable lead to the center end of the wound spring. Wires 96 provide a path from the center of the wound spring to the circuit board 40 and serves to complete the electrical connection between the lead cables and the circuit board.

Figure 8:
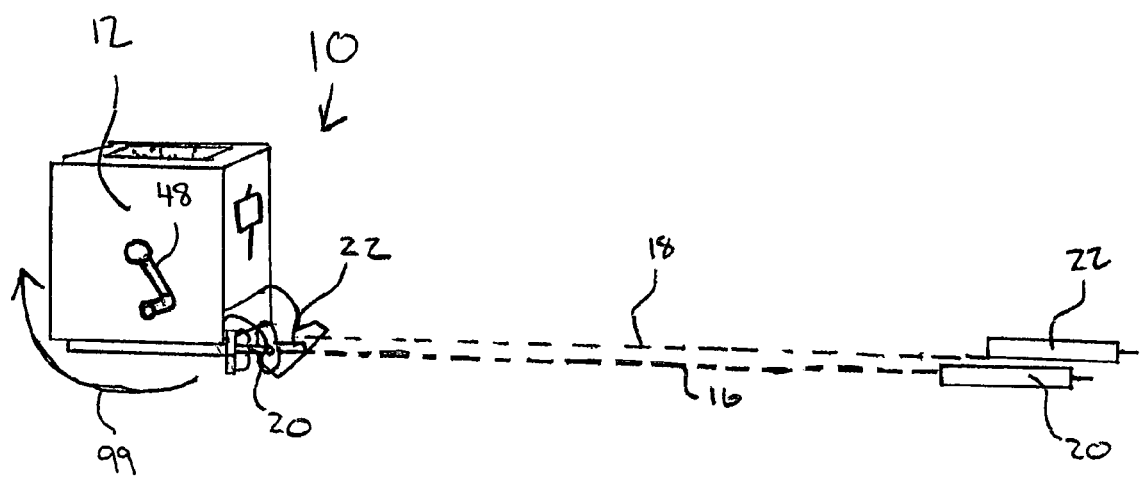
FIG. 8 shows an alternative embodiment of the electrical meter of FIG. 1 including a crank.

In yet another alternative embodiment shown in FIG. 8, the spool or spools are not spring biased, but are controlled by at least one crank 48 positioned on the outside of the meter housing and engaged with the spool. The crank engages the spool such that rotation of the crank in the direction of arrow 99 rotates the spool 14 and re-winds the lead cables 16 and 18 on the spool. In this embodiment, the user simply pulls the heads 20 and 22 away from the housing 12 to unwind the lead cables 16 and 18 during use of the meter. Then, in order to rewind the cables 16 and 18 on the spool following use of the meter, the user simply turns the crank 48 in the direction of arrow 99.

The circuit board 40 comprises a number of electronic components used to take electronic measurements. The circuitry included on the circuit board will vary depending upon the application desired from the electrical meter. Such circuit configurations are known to those of skill in the art, and may be provided by the manufacturer of the meter or outsourced from a third party supplier. Batteries 32 provide power for the electrical components of the circuit board 40. A battery compartment 34 is provided near the back 66 of the housing 12. A removable battery cover 36 (see FIG. 4) is provided on the top 68 of the housing 12 to provide access to the battery compartment 34.

The display 40 is also powered by the batteries 32 in the battery compartment 34. The display 40 is a digital display, such as an LED display or an LCD display, providing a digital reading for the user. However, the display 40 could be an analog display with a scale and a needle to show readings taken with the meter 10. The display 40 is attached to an opening in the housing 12 such that the bottom of the display is positioned within the housing, but the face of the display is visible from the exterior of the housing. The display is electrically connected to the circuit board 30, which provides measurement amounts for output on the display.

An on/off switch (not shown) may be provided for the display, allowing the user to manually turn the display on and off. However, in one embodiment the display may be configured to turn on when the spool 14 rotates to a certain location, indicating that the user has pulled the heads 20 and 22 of the lead cables 16 and 18 away from the housing and is about to take a measurement. For example, with reference to FIG. 2, the front of the circuit board 40 may include a sensor near position 42 and a tag near position 44. Movement of the tag past the sensor causes the sensor to fire and energize (i.e., turn on) the display. With this embodiment, the spool may be turned off automatically after the electrical measurement circuitry on the circuit board has received the same reading for a predetermined period of time. Alternatively, the sensor and associated circuitry may keep track of the number of times the tag has passed and turn off the display when the tag returns past the sensor in the opposite direction the same number of times, thereby indicating that the heads 20 and 22 have been returned to the housing 12. The tag and sensor combination may be any of a number of combinations known to those of skill in the art. For example, the sensor may be an optical sensor and the tag may be a bar code or other character recognizable by the sensor. As another example, the sensor may be a light beam broken by a physical tag on the spool. Of course numerous other arrangements are possible for the tag and sensor, including mechanical and/or magnetic sensors and associated tags. Furthermore, the on/off switch may take any number of different forms as will be readily apparent to one of skill in the art. For example, the on/off switch may be a sensor that automatically detects when the heads are contacted to a conductive surface.

A lock 50 is provided on the housing for locking the spool in place when the cable leads are extended from the housing. The lock includes an exterior lever 52 and a spool pad 56 with a shaft 54 extending in between. The shaft 54 rides in the slit 76 in the housing 12 such that the lock may be moved upward and downward along the slit 76. When the lock is in the upward (unlocked) position, the spool pad is removed from the spool, allowing the spool to rotate. When the lock is in the downward (locked) position, the spool pad is in contact with the spool, prohibiting the spool from rotating. In one embodiment of the invention, the lock 50 is also used as the on/off switch, such that the display is only powered on when the lock is in the downward (locked) position.

A clip 24 is provided on the sidewall 62 of the housing 12. The clip 24 is a standard belt clip often provided in association with tape measures and other devices that allows the device to be retained upon a belt or other garment such as a pair of pants. Of course, the clip 24 may take other forms that allow the clip to be attached to different locations on the user or nearby structure. For example, the clip may comprise a magnetic device capable of securing the meter to a metal plate.

A hinged cover 26 is provided on the front of the housing 12. The hinged cover 26 is attached to the housing at hinge 28 just above the apertures 72 and 74 where the lead cables extend from the housing. The hinged cover 26 is curved in shape such that it extends around the heads 20 and 22 when they are seated against the housing 12, and the free end of the hinged cover 26 contacts the housing under the apertures 72 and 74. When the heads of the meter are pulled away from the housing the hinged cover is pivoted upward to expose the heads. When the heads are returned to the meter, the cover is pivoted downward to cover the heads and prevent damage to the heads.

Figure 7:
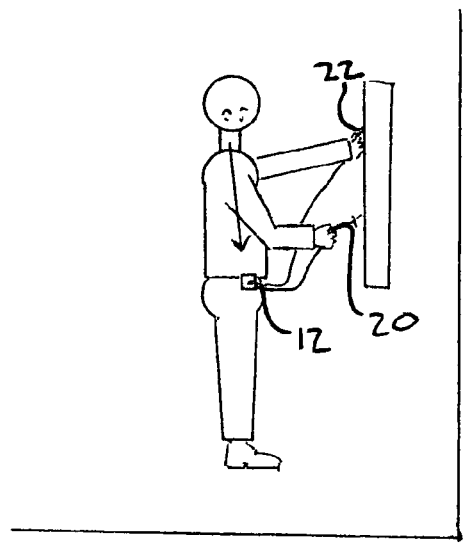
FIG. 7 shows the electrical meter of FIG. 1 in use by an electrician.

In operation, an electrician clips the electrical meter with retractable leads 10 on his or her belt for use at a convenient time. Because the meter housing 12 is attached to the belt of the electrician, he or she has two hands with which to manipulate the heads 20 and 22 during use of the meter. When the electrician desires to take an electrical measurement with the meter, the electrician pulls the heads away from the meter and extends them toward the circuit where the measurement will be taken. As the heads are pulled away from the meter, the connected leads are pulled along with the heads. This causes the spool to rotate in the direction of arrow 98, as shown in FIG. 1. Rotation of the spool in this direction causes the wound spring to be further compressed and biases the spool toward rotation in the direction opposite the direction of arrow 98. To prevent the leads from being accidentally re-wound upon the spool during use of the meter 10, the electrician may move the lock 50 into the locked position, thereby maintaining the angular position of the spool. As shown in FIG. 7, with the heads 20 and 22 in contact with the circuit to be measured, the electrician can simply look down at the display on the housing 12 attached to his or her belt to get the desired circuit reading and/or measurement. Once the electrician unlocks the spool and releases the heads, the spring biased spool rotates opposite the direction of arrow 98 and automatically retracts the cable leads into the housing and re-winds the cable leads upon the spool. With the cable leads properly re-wound upon the spool, the cable leads are protected against damage when the meter is not in use.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

What is claimed is:

1. An electrical meter comprising:

a. a housing having at least one aperture;

b. an electrical measurement circuit mounted within the housing;

c. a first lead cable and a second lead cable connected to the electrical measurement circuit, the first lead cable and the second lead cable both including a first end secured within the housing and a second end leading through the at least one aperture in the housing, the first lead cable and second lead cable configured to be fed through the at least one aperture such that a substantial portion of the first lead cable and second lead cable extend from the housing, and the first lead cable and the second lead cable configured to be retracted back through the at least one aperture such that a substantial portion of the first lead cable and the second lead cable are enclosed within the housing;

d. a wound spring positioned within the housing and connected to a spool, the wound spring configured to bias the spool against rotation in a first rotational direction and configured to automatically retract the first lead cable through the at least one aperture, the wound spring providing an electrical connection between the first lead cable and the electrical measurement circuit;

e. a display electrically connected to the electrical measurement circuit, the display configured to display electrical measurements taken using the first lead cable and the second lead cable; and f. a sensor mounted in the housing and a tag attached to the spool, wherein movement of the tag past the sensor causes the display to turn on.

2. The electrical meter of claim 1 further comprising a first head attached to the second end of the first lead cable and a second head attached to the second end of the second lead cable.

3. An electrical meter comprising:
(a) a substantially closed housing;
(b) a lead cable including a first end positioned within the housing and a second end positioned outside of the housing;
(c) a wound spring mounted within the housing and connected to a spool, the first end of the lead cable engaging the spool, and the wound spring and spool configured to bias the second end of the lead cable toward the housing;
(d) an electrical measurement circuit positioned within the housing and electrically connected to the lead cable, wherein the electrical connection between the lead cable and the electrical measurement circuit includes an electrical path upon the wound spring; and
(e) a display electrically connected to the electrical measurement circuit.

4. The electrical meter of claim 3 further comprising a stationary axle mounted within the housing, wherein the spool and the wound spring are concentric at the axle.

5. The electrical meter of claim 3 wherein the spool is configured to rotate in a first direction when an outside force pulls the second end of the lead cable away from the housing.

6. The electrical meter of claim 3 wherein the spool is configured to rotate in a second direction that winds the lead cable on the spool when the outside force is removed from the second end of the lead cable.

7. The electrical meter of claim 3 wherein the second end of the lead cable comprises a head with an electrical contact.

8. The electrical meter of claim 7 wherein the head is an alligator clip.

9. The electrical meter of claim 7 wherein the head is a post.

10. An electrical meter comprising:
(a) a substantially closed housing;
(b) a lead cable including a first end positioned within the housing and a second end positioned outside of the housing;
(c) a biasing member mounted within the housing, the first end of the lead cable engaging the biasing member, and the biasing member configured to bias the second end of the lead cable toward the housing, the biasing member comprises a spool configured to rotate in a first direction when an outside force pulls the second end of the lead cable away from the housing, and rotate in a second direction that winds the lead cable on the spool when the outside force is removed from the second end of the lead cable;
(d) an electrical measurement circuit positioned within the housing and electrically connected to the lead cable;
(e) a display electrically connected to the electrical measurement circuit; and
(f) a sensor mounted in the housing and a tag attached to the spool, wherein movement of the tag past the sensor causes the display to turn on.

11. The electrical meter of claim 10 further comprising a clip attached to the exterior of the housing.

12. The electrical meter of claim 10 further comprising a lock positioned upon the housing, the lock configured to move between a locked position and an unlocked position, wherein movement of the lock to the locked position prohibits movement of the biasing member.

13. The electrical meter of claim 10 wherein the display is a digital display.

14. The electrical meter of claim 10 wherein the display is an analog display.

15. The electrical meter of claim 10 wherein the display is mounted upon the housing.

16. The electrical meter of claim 10 wherein the electrical measurement circuit measures continuity.

17. The electrical meter of claim 10 wherein the electrical measurement circuit measures voltage.

18. The electrical meter of claim 10 wherein the electrical measurement circuit measures resistance.

19. The electrical meter of claim 10 wherein the electrical measurement circuit measures electric current.

20. The electrical meter of claim 10 wherein the lead cable is a first lead cable and the electrical meter further comprises a second lead cable.

21. The electrical meter of claim 20 wherein the biasing member comprises a first spool and a second spool, the first lead cable engaging the first spool and the second lead cable engaging the second spool.

* * * * *